United States Patent [19]

Sandhu et al.

[11] Patent Number: 5,368,687
[45] Date of Patent: Nov. 29, 1994

[54] SEMICONDUCTOR PROCESSING METHOD OF ETCHING INSULATING INORGANIC METAL OXIDE MATERIALS AND METHOD OF CLEANING METALS FROM THE SURFACE OF SEMICONDUCTOR WAFERS

[75] Inventors: Gurtej S. Sandhu; Donald L. Westmoreland; Pierre Fazan, all of Boise, Id.

[73] Assignee: Micron Technology, Inc., Boise, Id.

[21] Appl. No.: 31,572

[22] Filed: Mar. 15, 1993

[51] Int. Cl.$^5$ ............................................. H01L 21/00
[52] U.S. Cl. ..................... 156/664; 156/643; 156/646; 156/667; 156/662; 156/651; 156/635
[58] Field of Search ............... 156/643, 646, 667, 664, 156/662, 651, 635

[56] References Cited

U.S. PATENT DOCUMENTS

| | | | |
|---|---|---|---|
| 4,451,327 | 5/1984 | Nelson | 156/646 |
| 5,098,516 | 3/1992 | Norman et al. | 156/646 |
| 5,100,499 | 3/1992 | Douglas | 156/646 |
| 5,262,001 | 11/1993 | Takehara | 156/643 |

OTHER PUBLICATIONS

"Plasma Etching of PLT-Thin Films and Bulk PLZT Using Fluorine- and Chlorine Based Gases"; Poor et al., Mater. Res. Soc. Symp. Proc.; 200; abstract only; 1990.
K. Koyama et al., "A Stacked Capacitor With ($Ba_x$-$SR_{1-x}$)$TiO_3$ For 256M DRAM," IEDM 91, 824.

*Primary Examiner*—R. Bruce Breneman
*Assistant Examiner*—George Goudreau
*Attorney, Agent, or Firm*—Wells, St. John, Roberts, Gregory & Matkin

[57] ABSTRACT

In one aspect of the invention, a semiconductor processing method includes the following steps: a) providing a layer of an insulating inorganic metal oxide material atop a semiconductor wafer; b) subjecting the wafer with exposed insulating inorganic metal oxide material to dry etching conditions using a halogen or pseudohalogen based chemistry to react the insulating inorganic metal oxide material into solid halogenated or pseudohalogenated material; and c) reacting the solid halogenated or pseudohalogenated material with a gaseous organic ligand precursor to form a gaseous metal organic coordination complex incorporating the organic ligand precursor and to form a gaseous halogenated or pseudohalogenated species which are expelled from the wafer. In another aspect, a semiconductor processing method of removing or otherwise cleaning metal from a semiconductor wafer includes the following steps: a) subjecting a semiconductor wafer having exposed metal to a dry halogen or pseudohalogen gas to react the metal into solid halogenated or pseudohalogenated material; and b) reacting the solid halogenated or pseudohalogenated material with a gaseous organic ligand precursor to form a gaseous metal organic coordination complex incorporating the organic ligand precursor and metal, and to form a gaseous halogenated or pseudohalogenated species, the complex and species being expelled from the wafer. Alternately, the metal is directly incorporated with the gaseous organic ligand precursor without previous halogenation.

32 Claims, No Drawings

SEMICONDUCTOR PROCESSING METHOD OF ETCHING INSULATING INORGANIC METAL OXIDE MATERIALS AND METHOD OF CLEANING METALS FROM THE SURFACE OF SEMICONDUCTOR WAFERS

TECHNICAL FIELD

This invention relates principally to removal of insulating inorganic metal oxide materials, including ferroelectric materials, in semiconductor wafer processing.

BACKGROUND OF THE INVENTION

Insulating inorganic metal oxide materials, such as ferroelectric materials or perovskite material, have high dielectric constants and low current leakage which make them attractive as cell dielectric materials for high density DRAMs and non-volatile memories. Perovskite material and other ferroelectric materials exhibit a number of unique and interesting properties—both physical and electrical. The defining property of a ferroelectric material is that it possesses a spontaneous polarization that can be reversed by an applied electric field. Specifically, these materials have a characteristic temperature, commonly referred to as the transition temperature, at which the material makes the structural phase change from a polar phase (ferroelectric) to a non-polar phase, typically called the paraelectric phase.

Despite the advantages of high dielectric constants and low leakage, insulating inorganic metal oxide materials suffer from many drawbacks. One major hurdle to incorporating perovskites into semiconductor processing methods is the fact that no reliable method for dry etching such materials exists. The major problem is that most of the inorganic compounds formed are solids having high boiling temperatures. In other words, the conventional dry etching of perovskite material results in formation of solid compounds, as opposed to gaseous compounds as in dry etching techniques for other materials which are then easily expelled from the wafer. For example, dry etching of perovskite materials containing barium of strontium typically produces chloride, such as $BaCl_x$, $SrCl_x$, and $TiCl_4$. Only the latter of these is volatile under typical semiconductor wafer processing conditions.

Accordingly, there remains a need for development of semiconductor wafer processing methods enabling use of insulating inorganic metal oxide materials as capacitor materials involving dry etching processes for such insulating inorganic metal oxide materials.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method comprises the following steps:

providing a layer of a insulating inorganic metal oxide material atop a semiconductor wafer;

subjecting the wafer with exposed insulating inorganic metal oxide material to dry etching conditions using a halogen or pseudohalogen based chemistry to react the insulating inorganic metal oxide material into solid halogenated or pseudohalogenated material; and reacting the solid halogenated or pseudohalogenated material with a gaseous organic ligand precursor to form a gaseous metal organic coordination complex incorporating the organic ligand precursor and to form a gaseous halogenated or pseudohalogenated species which are expelled from the wafer.

The method operates in effect by volatilizing the formed solid halogenated or pseudohalogenated material by converting them to low boiling point metal-organic compounds (volatile metal-organic complexes) in situ which are expelled away from the wafer. As well, the solid halogen or pseudohalogenated material is converted into a volatile form which is expelled from the wafer. The above sequence of steps can be repeated over time intervals of seconds or less, so as to etch an entire film of exposed insulating inorganic metal oxide material. The process can be optimized by pulse width, gas flow rates and plasma conditions as outlined below. The process will provide low process cost and high throughput. Standard dry etch conditions would be utilized. Such would include by way of example only a pressure ranging from about 1 mTorr to 10 Torr, and a temperature ranging from about −40° C. to 200° C.

Example insulating inorganic metal oxide materials usable in accordance with the invention include ferroelectrics or other perovskite materials, such as titanates, zirconates, niobates, tantalates and nitrates, such as those shown below.

Barium Titanate $BaTiO_3$
Barium Strontium Titanate $(Ba,Sr)TiO_3$
Barium Lead Titanate $(Ba,Pb)TiO_3$
Lead Titanate $PbTiO_3$
Lead Zirconate $PbZnO_3$
Lead Zirconate Titanate $Pb(Zn,Ti)O_3$
Lead Lanthinum Titanate $(Pb,La)TiO_3$
Lead Lanthinum Zirconate Titanate $(Pb,La)(Zn,Ti)O_3$
Strontium Titanate $SrTiO_3$
Potassium Nitrate $KNO_3$
Lithium Niobate $LiNbO_3$
Lithium Tantalate $LiTaO_3$
Lead Magnesium Niobate $Pb(Mg,Nb)O_3$
(Mixed phases) $Pb(Mg,Nb)O_3:PbTiO_3$
Bismuth Titanate $Bi_4Ti_3O_{12}$ Example organic ligand precursors comprise cyclic, polycyclic and aromatic compounds, and materials which upon reaction with the halogenated or pseudohalogenated material form a metal-organic coordination complex which is heterocyclic. Betadiketones are examples of the latter of such materials. Example materials include cyclopentadiene, indene, and fluorene as shown below:

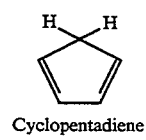

Cyclopentadiene

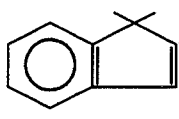

Indene

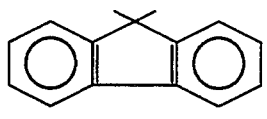

Fluorene

By further way of example only, other products might be utilized such as alkyl or other substituted cyclopentadiene derivatives, such as methylcyclopentadiene, pentamethylcyclopentadiene and trimethylsilycyclopentadiene, as shown below:

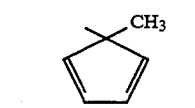

Methylcyclopentadiene

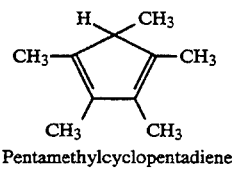

Pentamethylcyclopentadiene

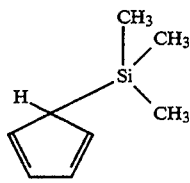

Trimethylsilocyclopentadiene

Examples of diketones include acetyl acetone, hexafluoroacetyl acetone 1,1,1,2,2,3,3 heptafluoro-7,7,-dimethyl-4,6-octanedione, and dipivaloylmethane as shown below:

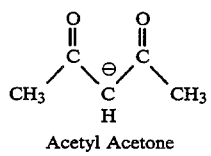

Acetyl Acetone

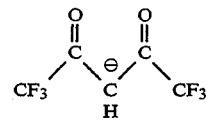

Hexafluoroacetyl Acetonato

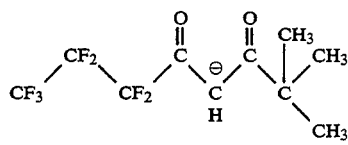

1,1,1,2,2,3,3, heptafluoro-
7,7-dimethyl-4,6-octanedionato

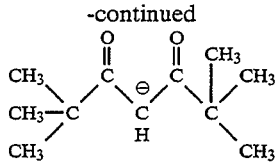

Dipivaloymethanate

One example halogenated dry etch chemistry would include chlorine, such as conventional dry plasma etching using $CCl_4$ and an inert carrier gas such as Ar. Where, for example, such a chemistry was utilized for etching a barium strontium titanate, the following reaction would typically occur:

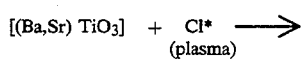

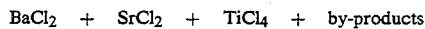

The $BaCl_2$ could effectively be volatilized by reaction with a gaseous or organic ligand precursor such as fluorene or trifluoro acac according to the following respective equations.

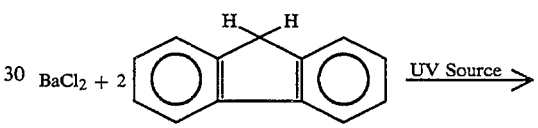

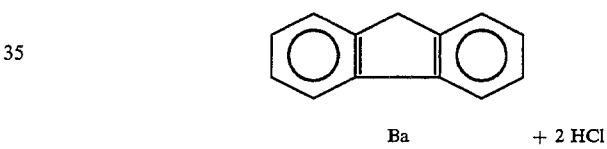

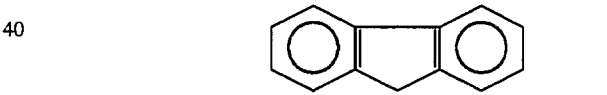

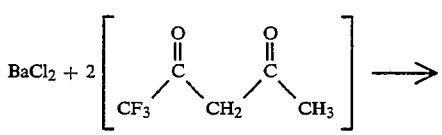

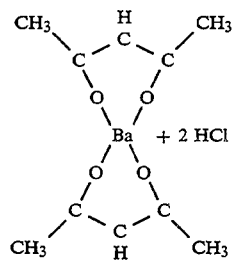

The produced HCl is an example of a gaseous halogenated species which is expelled from the wafer, along with the formed gaseous metal organic coordination complexes which are shown. The same sort of reactions would occur for the $SrCl_2$.

By way of example only, another gaseous halogenated or pseudohalogenated species is shown by the following general reaction equation for combination of a metal chloride with trimethylsilylcyclopentadiene, where "M" represents the metal.

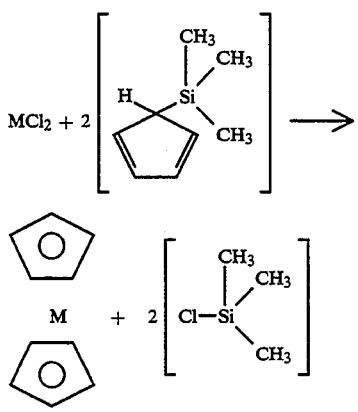

The dry etching conditions might include plasma chemistry or reactive ion etch chemistry. Preferably, the first reaction includes application of energy sufficient to induce a plasma halogenated or pseudohalogenated species for reaction with the insulating inorganic metal oxide material. Gases and energy might be pulsed at suitable intervals so as to realize desired and modified results. For example, one or both of the reactant halogen or pseudohalogen gases or energy might be pulsed.

Specifically, one example of processing would occur sequentially by, a) energy application to the wafer on ($E_{on}$) and reactant halogen or pseudohalogen flow to the wafer on ($H_{on}$); b) energy application to the wafer off ($E_{off}$) and reactant halogen or pseudohalogen flow to the wafer off ($H_{off}$); c) gaseous organic ligand precursor flow to the wafer on ($P_{on}$); d) gaseous organic ligand precursor flow to the wafer off ($P_{off}$), followed by a repeat of the a) through d) steps. Alternately, aspects of the invention comprise feeding, a) reactant halogen or pseudohalogen, and b) gaseous organic ligand precursor to the wafer at the same time. Further alternately, aspects of the invention comprise application of energy sufficient to induce a plasma halogenated or pseudohalogenated species for reaction with the ferroelectric material, wherein energy is constantly applied to the wafer during processing. With such step, reactant halogen or pseudohalogenated gaseous flow and reactant gaseous organic ligand precursor flow might be pulsed or substantially constantly fed to the wafer during processing.

The invention also contemplates using ultraviolet light in certain cases, such as shown with respect to fluorene above, for facilitating reaction and subsequent volatilization of the solid metal halogen materials.

Aspects of the invention might also be utilized for removing metal contaminates such as flakes or other materials, or even metal layers, from semiconductor wafers. Such might be accomplished in a number of ways. For example in one aspect, a semiconductor processing method of removing or otherwise cleaning metal from a semiconductor wafer comprises the following steps:
subjecting a semiconductor wafer having exposed metal to a dry halogen or pseudohalogen gas to react the metal into solid halogenated or pseudohalogenated material; and
reacting the solid halogenated or pseudohalogenated material with a gaseous organic ligand precursor to form a gaseous metal organic coordination complex incorporating the organic ligand precursor and metal, and to form a gaseous halogenated or pseudohalogenated species, the complex and species being expelled from the wafer.

Processing could otherwise occur as described above with respect to the deposition and etching of ferroelectric materials. Otherwise solid materials, such as halogen or pseudohalogenated metal compounds, are in essence volatilized by reaction with such gaseous organic ligand precursors.

Further, reaction could occur by direct incorporation of the metal with the ligand precursor. In accordance with this aspect, a semiconductor processing method of removing or otherwise cleaning metal from a semiconductor wafer comprises subjecting a semiconductor wafer having exposed metal to a gaseous organic ligand precursor to form a gaseous metal organic coordination complex incorporating the organic ligand precursor and metal, the complex being expelled from the wafer.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:
1. A semiconductor processing method comprising the following steps:
providing a layer of an insulating inorganic metal oxide material atop a semiconductor wafer;
subjecting the wafer with exposed insulating inorganic metal oxide material to dry etching conditions using a halogen or pseudohalogen based chemistry to react the insulating inorganic metal oxide material into solid halogenated or pseudohalogenated material; and
reacting the solid halogenated or pseudohalogenated material with a gaseous organic ligand precursor to form a gaseous metal organic coordination complex incorporating the organic ligand precursor and to form a gaseous halogenated or pseudohalogenated species which are expelled from the wafer.

2. The semiconductor processing method of claim 1 wherein the insulating inorganic metal oxide material comprises a ferroelectric material.

3. The semiconductor processing method of claim 2 wherein the ferroelectric material is selected from the group consisting of zirconates, niobates, nitrates, titanates and tantalates, or mixtures thereof.

4. The semiconductor processing method of claim 1 wherein the organic ligand precursor comprises an aromatic compound.

5. The semiconductor processing method of claim 1 wherein the organic ligand precursor comprises a material which upon reaction with the halogenated or pseudohalogenated material forms a metal organic coordination complex which is heterocyclic.

6. The semiconductor processing method of claim 1 wherein the organic ligand precursor comprises cyclopentadiene or a cyclopentadiene derivative.

7. The semiconductor processing method of claim 1 wherein the organic ligand precursor comprises a fused polycyclic.

8. The semiconductor processing method of claim 1 wherein the organic ligand precursor comprises a betadiketone which upon reaction with the halogenated or pseudohalogenated material forms a metal organic coordination complex which is heterocyclic.

9. The semiconductor processing method of claim 1 wherein the insulating inorganic metal oxide material comprises a material selected from the group consisting of titanates, zirconates, tantalates and niobates, or mixtures thereof; and the organic ligand precursor comprises an aromatic compound.

10. The semiconductor processing method of claim 1 wherein the insulating inorganic metal oxide material comprises a material selected from the group consisting of titanates, zirconates, tantalates and niobates, or mixtures thereof; and the organic ligand precursor comprises a material which upon reaction with the halogenated or pseudohalogenated material forms a metal organic coordination complex which is heterocyclic.

11. The semiconductor processing method of claim 1 wherein the dry etching chemistry comprises chlorine based chemistry.

12. The semiconductor processing method of claim 1 wherein the subjecting step comprises application of energy sufficient to induce a plasma halogenated or pseudohalogenated species for reaction with the insulating inorganic metal oxide material.

13. The semiconductor processing method of claim 12 wherein the energy application is pulsed during processing.

14. The semiconductor processing method of claim 1 wherein reactant halogen or pseudohalogen gaseous flow is pulsed during processing.

15. The semiconductor processing method of claim 1 wherein reactant gaseous organic ligand precursor flow is pulsed during processing.

16. The semiconductor processing method of claim 1 wherein the subjecting step comprises application of energy sufficient to induce a plasma halogenated or pseudohalogenated species for reaction with the insulating inorganic metal oxide material; and processing occurs sequentially by, a) energy application to the wafer on and reactant halogen or pseudohalogen flow to the wafer on; b) energy application to the wafer off and reactant halogen or pseudohalogen flow to the wafer off; c) gaseous organic ligand precursor flow to the wafer on; d) gaseous organic ligand precursor flow to the wafer off, followed by at least one repeat of steps a) through d).

17. The semiconductor processing method of claim 1 comprising feeding, a) reactant halogen or pseudohalogen, and b) gaseous organic ligand precursor to the wafer at the same time.

18. The semiconductor processing method of claim 1 comprising feeding, a) reactant halogen or pseudohalogen, and b) gaseous organic ligand precursor to the wafer at the same time; and the subjecting step comprises application of energy sufficient to induce a plasma halogenated or pseudohalogenated species for reaction with the insulating inorganic metal oxide material.

19. The semiconductor processing method of claim 1 wherein the subjecting step comprises application of energy sufficient to induce a plasma halogenated or pseudohalogenated species for reaction with the insulating inorganic metal oxide material, and wherein energy is constantly applied to the wafer during processing; and wherein reactant halogen or pseudohalogen gaseous flow and reactant gaseous organic ligand precursor flow are pulsed during processing.

20. The semiconductor processing method of claim 1 wherein the subjecting step comprises application of energy sufficient to induce a plasma halogenated or pseudohalogenated species for reaction with the insulating inorganic metal oxide material, and wherein energy is constantly applied to the wafer during processing; and wherein reactant halogen or pseudohalogen gaseous flow and reactant gaseous organic ligand precursor flow are substantially constant during processing.

21. The semiconductor processing method of claim 1 wherein the reacting step comprises exposing the wafer to ultraviolet light.

22. A semiconductor processing method of removing or otherwise cleaning metal from a semiconductor wafer, the method comprising the following steps:

subjecting a semiconductor wafer having exposed metal to a dry halogen or pseudohalogen gas to react the metal into solid halogenated or pseudohalogenated material; and reacting the solid halogenated or pseudohalogenated material with a gaseous organic ligand precursor to form a gaseous metal organic coordination complex incorporating the organic ligand precursor and metal, and to form a gaseous halogenated or pseudohalogenated species, the complex and species being expelled from the wafer.

23. The semiconductor processing method of claim 22 wherein the organic ligand precursor comprises an aromatic compound.

24. The semiconductor processing method of claim 22 wherein the organic ligand precursor comprises a material which upon reaction with the halogenated or pseudohalogenated material forms a metal organic coordination complex which is heterocyclic.

25. The semiconductor processing method of claim 22 wherein the organic ligand precursor comprises cyclopentadiene or a cyclopentadiene derivative.

26. The semiconductor processing method of claim 22 wherein the organic ligand precursor comprises a betadiketone which upon reaction with the halogenated or pseudohalogenated material forms a metal organic coordination complex which is heterocyclic.

27. The semiconductor processing method of claim 22 wherein the reacting step comprises exposing the wafer to ultraviolet light.

28. A semiconductor processing method of removing or otherwise cleaning metal from a semiconductor wafer comprising subjecting a semiconductor wafer having exposed metal to a gaseous organic ligand precursor to form a gaseous metal organic coordination complex incorporating the organic ligand precursor and metal, the organic ligand precursor comprising an aromatic compound, the complex being expelled from the wafer.

29. A semiconductor processing method of removing or otherwise cleaning metal from a semiconductor wafer comprising subjecting a semiconductor wafer having exposed metal to a gaseous organic ligand precursor to form a gaseous metal organic coordination complex incorporating the organic ligand precursor and metal, the organic ligand precursor comprising a material which upon reaction with the metal forms a metal organic coordination complex which is heterocyclic, the complex being expelled from the wafer.

30. A semiconductor processing method of removing or otherwise cleaning metal from a semiconductor wafer comprising subjecting a semiconductor wafer having exposed metal to a gaseous organic ligand precursor to form a gaseous metal organic coordination complex incorporating the organic ligand precursor and metal, the organic ligand precursor comprising cyclopentadiene or a cyclopentadiene derivative, the complex being expelled from the wafer.

31. A semiconductor processing method of removing or otherwise cleaning metal from a semiconductor wafer comprising subjecting a semiconductor wafer having exposed metal to a gaseous organic ligand precursor to form a gaseous metal organic coordination complex incorporating the organic ligand precursor and metal, the organic ligand precursor comprising a fused polycyclic, the complex being expelled from the wafer, 32. A semiconductor processing method of removing or otherwise cleaning metal from a semiconductor wafer comprising subjecting a semiconductor wafer having exposed metal to a organic ligand precursor to form a gaseous metal organic coordination complex incorporating the organic ligand precursor and metal, the organic ligand precursor comprising a betadiketone which upon reaction with the metal forms a metal organic coordination complex which is heterocyclic, the complex being expelled from the wafer.

* * * * *